United States Patent [19]

Silvis et al.

[11] Patent Number: 5,105,258
[45] Date of Patent: Apr. 14, 1992

[54] METAL SYSTEM FOR SEMICONDUCTOR DIE ATTACH

[75] Inventors: Duane C. Silvis, Scottsdale; Udey Chaudhry, Mesa; James R. Eckert, Tempe; Edward J. Mischen, Chandler, all of Ariz.

[73] Assignee: Motorola, Inc., Schaumburg, Ill.

[21] Appl. No.: 616,970

[22] Filed: Nov. 21, 1990

[51] Int. Cl.5 ............... H01L 39/02; H01L 23/02; H01L 23/48; H01L 29/54
[52] U.S. Cl. ..................... 357/71; 357/80; 357/81; 361/381; 361/388
[58] Field of Search ............... 357/71, 81, 74; 361/380, 381, 382, 383, 384, 385, 386, 387, 388, 389

[56] References Cited

U.S. PATENT DOCUMENTS

| | | | |
|---|---|---|---|
| 4,650,922 | 3/1987 | McPherson | 357/74 |
| 4,680,618 | 7/1987 | Kuroda et al. | 357/81 |
| 4,872,047 | 10/1989 | Fister et al. | |
| 4,946,376 | 8/1990 | Sharma et al. | 357/81 |
| 4,965,659 | 10/1990 | Sasame et al. | 357/71 |

Primary Examiner—Andrew J. James
Assistant Examiner—Carl Whitehead, Jr.
Attorney, Agent, or Firm—Joe E. Barbee

[57] ABSTRACT

A layer of aluminum is formed on a surface of a thermal expansion buffer which is used in a semiconductor package. A semiconductor die is attached to the aluminum using a die attach material. An electrical connection for the die is created by attaching a wire from the semiconductor die to the aluminum surface of the buffer. This provides a reliable semiconductor package useful in a high temperature environment.

9 Claims, 1 Drawing Sheet

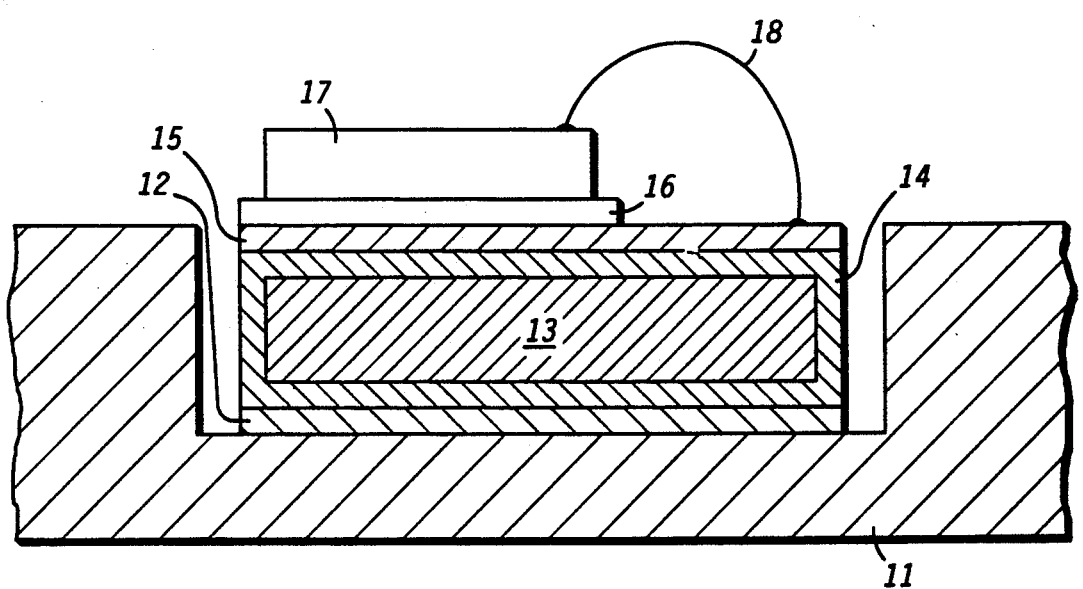

METAL SYSTEM FOR SEMICONDUCTOR DIE ATTACH

BACKGROUND OF THE INVENTION

The present invention relates, in general, to semiconductor packages, and more particularly, to a metal system for a semiconductor package that has a thermal expansion buffer.

Thermal expansion buffers generally have been used in the semiconductor industry. These buffers were used to reduce the effects of thermal expansion mismatches between low coefficient of thermal expansion (CTE) materials such as silicon and high coefficient of thermal expansion (CTE) materials used to construct semiconductor packages such as copper, steel, aluminum, etc. For example, a low CTE silicon die that was attached to a section of high CTE copper could be damaged by the difference of thermal expansion rates between the two materials. Placing an expansion buffer between the silicon and the copper reduced stresses that were placed on the silicon die. The buffer expanded at a rate that was between the expansion rate of silicon and the expansion rate of the package material thereby absorbing most of the stresses that occurred. Often the buffers were coated with a material to eliminate the formation of detrimental intermetallic compounds between the materials used for the buffer and materials used for attaching either the die or the buffer. These coatings often were materials which did not readily form strong bonds with silicon attachment materials. For example, one common configuration was a nickel coated thermal expansion buffer. Common materials, such as silver filled glass, used to bond semiconductor die to semiconductor packages did not readily bond to the nickel coating. Semiconductor die that were attached to these buffers generally experienced bond failures after repeated cycles of thermal expansion.

Additionally, some semiconductor die required a direct connection between the semiconductor die and the package. This was generally provided by a wire that had one end bonded to the semiconductor die and the other end bonded to the thermal expansion buffer. Wires bonded to previous thermal expansion buffers also failed after repeated temperature cycles.

Accordingly, it would be desirable to have a metal attachment system that provides a reliable bond between a semiconductor die, and a thermal expansion buffer, and also provides a reliable attachment for a bonding wire.

SUMMARY OF THE INVENTION

The objects and advantages of the present invention are achieved by forming a layer of aluminum on a surface of a thermal expansion buffer. A semiconductor die is attached to the aluminum using a die attach material. An electrical connection for the die is created by attaching a wire from the semiconductor die to the aluminum surface of the buffer.

BRIEF DESCRIPTION OF THE DRAWINGS

The sole Figure is an enlarged cutaway view of a package which has a semiconductor die bonded to an aluminum coating that has been applied to a thermal expansion buffer in accordance with the present invention.

DETAILED DESCRIPTION OF THE DRAWINGS

The present invention provides a die attach layer to a thermal expansion buffer thereby increasing the adherence of a semiconductor die to the buffer, and also increasing the adherence of a bonding wire to the buffer.

While the invention is described with specific preferred embodiments, it is evident that many alternatives and variations will be apparent to those skilled in the art. More specifically the invention has been described for a particular thermal buffer structure and die attach material, although the method is directly applicable to other metal systems, other thermal buffer structures, as well as to other die attach materials.

The sole Figure illustrates a metallic layer 15 that has been applied to a thermal expansion buffer in order to facilitate attaching a semiconductor die 17 by the use of a die attach material 16. The thermal expansion buffer includes an expansion element 13 which has a barrier coating 14. The thermal expansion buffer is attached to a package substrate 11 by an attachment layer 12. Generally, the thermal expansion buffer is attached to package substrate 11 by soldering, spot welding, or brazing barrier coating 14 of the buffer, to substrate 11. Although, other means, such as an adhesive, could be used to attach the thermal expansion buffer. Expansion element 13 is a material having a CTE that is between the CTE of silicon and the CTE of substrate 11. In the preferred embodiment, expansion element 13 is formed from the group including molybdenum, rhenium, tungsten, copper, copper-tungsten, or alloys of these materials. Also in this embodiment, substrate 11 is formed from materials that have high thermal conductivity such as copper and copper alloys. Barrier coating 14 is a material that prevents the formation of detrimental intermetallic compounds between expansion element 13, and materials used to form attachment layer 12 and die attach layer 16. Generally, barrier coating 14 is formed from the group including nickel, cobalt, or alloys of these materials. In the preferred embodiment, barrier coating is nickel.

Materials used for attaching semiconductor die 17 to packages must readily adhere to silicon. Generally, these materials do not adhere well to materials used for barrier coating 14. Aluminum is a material that not only has good attraction to most materials used for die attachment material 16, but also adheres to and can be readily applied to barrier coating 14. When exposed to oxygen, aluminum instantly forms a layer of aluminum oxide on the exposed surface of the aluminum. Over time the thickness of the oxide increases. This oxide easily adheres to glass. Therefore, forming metallic layer 15 by applying a layer of aluminum to barrier layer 14 enhances the adherence of semiconductor die attach material 16 to the thermal expansion buffer. Aluminum layer 15 can be applied using a variety of different methods, but the layer should be sufficiently thick to provide good die bonding adhesion. In the preferred embodiment, a layer of aluminum approximately five microns thick is applied with a vapor deposition technique. Also in this embodiment, a silver filled glass or silver-glass die attach material is used for layer 16. The silver-glass material adheres well to the silicon used for semiconductor die 17 and to the aluminum used for layer 15.

Aluminum layer 15 also provides a suitable material for the attachment of bonding wires to provide electrical connection to the buffer. One example that is typical in the industry is bonding wire 18 which provides an electrical connection from semiconductor die 17 through the thermal expansion buffer to package substrate 11. Other bonding wires, such as between aluminum layer 15 and the package's lead frame, can also be attached to aluminum layer 15.

By now it should be appreciated that there has been provided a novel metal system for fabricating a semiconductor package having a thermal expansion buffer. The metal system can be used with many types of packages and is especially useful for packages that must dissipate a large amount of heat. The metal system provides excellent die attach adhesion and wire bond adhesion. The resulting package is capable of withstanding temperature cycling at extreme temperatures without damage thereby increasing the reliability of the package.

We claim:

1. A metal system for semiconductor die attach for use in a package for housing a semiconductor device, which package comprises:
   a heat conductive substrate;
   a thermal expansion buffer that has a nickel coating and is attached to the substrate wherein the thermal expansion buffer has a coefficient of thermal expansion that is between a coefficient of thermal expansion of the semiconductor die and a coefficient of thermal expansion of the substrate in order to buffer the die from the expansion of the substrate;
   a layer of aluminum on a surface of the nickel coated buffer;
   a layer of silver-glass attached to the layer of aluminum; and
   the semiconductor die attached to the layer of silver-glass.

2. The metal system of claim 1 wherein the substrate includes a copper or a copper alloy substrate.

3. The metal system of claim 1 wherein the thermal expansion buffer includes a molybdenum or copper-tungsten material that has a nickel coating.

4. The metal system of claim 1 further including a wire having a first end attached to the semiconductor die and a second end attached to the layer of aluminum.

5. The metal system of claim 1 wherein the layer of aluminum is approximately five microns thick.

6. The metal system of claim 1 wherein the package includes a lead frame, and a wire having a first end attached to the layer of aluminum and a second end attached to the lead frame.

7. A metal system for attaching a semiconductor die to a semiconductor package that comprises:
   a thermal expansion buffer having a barrier coating wherein the thermal expansion buffer has a coefficient of thermal expansion that is between a coefficient of thermal expansion of the semiconductor die and a coefficient of thermal expansion of the package in order to buffer the die from the expansion of the package;
   a layer of aluminum on at least one surface of the barrier coating;
   a die attach material covering at least a portion of the aluminum; and
   the semiconductor die positioned on the die attach material.

8. The metal system of claim 7 wherein the die attach material is a silver filled glass material.

9. The metal system of claim 7 wherein the layer of aluminum is approximately five microns thick.

* * * * *